United States Patent
Birdsley et al.

(10) Patent No.: US 6,417,680 B1
(45) Date of Patent: Jul. 9, 2002

(54) METHOD AND APPARATUS FOR STRESS TESTING A SEMICONDUCTOR DEVICE USING LASER-INDUCED CIRCUIT EXCITATION

(75) Inventors: Jeffrey D. Birdsley; Rama R. Goruganthu; Michael R. Bruce; Brennan V. Davis; Rosalinda M. Ring, all of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/408,663

(22) Filed: Sep. 29, 1999

(51) Int. Cl.[7] ............................................... G01R 31/02
(52) U.S. Cl. ..................................... 324/752; 324/765
(58) Field of Search ............................. 324/765, 750, 324/751, 752; 250/306, 491.1, 491.2, 341.4; 438/14–18

(56) References Cited

U.S. PATENT DOCUMENTS

| | | | |
|---|---|---|---|
| 5,334,540 A | * 8/1994 | Ishii | 324/765 |
| 5,394,098 A | * 2/1995 | Meyrueix et al. | 324/750 |
| 5,493,236 A | * 2/1996 | Ishii et al. | 324/752 |
| 5,781,017 A | 7/1998 | Cole, Jr. et al. | |
| 5,821,549 A | * 10/1998 | Talbot et al. | 250/307 |
| 5,872,360 A | * 2/1999 | Paniccia et al. | 250/341.4 |
| 5,930,588 A | * 7/1999 | Paniccia | 438/16 |
| 5,963,781 A | * 10/1999 | Winer | 438/14 |
| 6,020,746 A | * 2/2000 | Livengood | 324/754 |

\* cited by examiner

*Primary Examiner*—Vinh P. Nguyen

(57) ABSTRACT

According to an example embodiment, a laser is directed at a target region of a powered semiconductor device via the back side of the device, and active circuitry is selectively excited. In response to the excited circuitry, target circuitry is monitored and a degree of integrity of the operation of the semiconductor device is determined, for example, by detecting the output s/phase characteristics or by monitoring passive emissions from the device. The invention is particularly advantageous in connection with post-manufacture failure analysis.

20 Claims, 2 Drawing Sheets

METHOD AND APPARATUS FOR STRESS TESTING A SEMICONDUCTOR DEVICE USING LASER-INDUCED CIRCUIT EXCITATION

FIELD OF THE INVENTION

The present invention relates generally to the testing of semiconductor devices and, more particularly, to the testing of semiconductor devices via a back side involving laser-induced circuit excitation.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

To increase the number of pad sites available for a die, to reduce the electrical path to the pad sites, and to address other problems, various chip packaging techniques have been developed. One of these techniques is referred to as controlled collapse chip connection or "flip-chip" packaging. This packaging technology involves providing bonding pads of the die with metal (solder) bumps. Electrical connection to the package is made when the die is "flipped" over and soldered to the package. Each bump connects to a corresponding package inner lead. The resulting packages are low profile and have low electrical resistance and a short electrical path. The output terminals of the package, which are sometimes ball-shaped conductive bump contacts, are typically disposed in a rectangular array. These packages are occasionally referred to as "Ball Grid Array" (BGA) packages. Alternatively, the output terminals of the package may be pins and such packages are commonly known as pin grid array (PGA) packages.

Once the die is attached to such a package the back side portion of the die remains exposed. The transistors and other circuitry are generally formed in a very thin epitaxially-grown silicon layer on a single crystal silicon wafer from which the die is singulated. The side of the die including the epitaxial layer containing the transistors, and the other active circuitry is often referred to as the circuit side of the die or front side of the die. The circuit side of the die is positioned very near the package. The circuit side opposes the back side of the die. Between the back side and the circuit side of the die is single crystalline silicon.

The positioning of the circuit side near the package provides many of the advantages of the flip chip. However, in some instances the orientation of the die with the circuit side face down on a substrate is disadvantageous. Due to this face down orientation of the die, the transistors and circuitry near the circuit side are not directly accessible for testing, modification, or other purposes. Consequently, access to the transistors and circuitry near the circuit side must be from the back side of the chip, and testing methods are limited to those that are feasible using back side access. In addition to flip-chip type devices, back side access is also sometimes necessary or beneficial for other semiconductor devices.

A particular attribute of semiconductor manufacturing involves testing the integrity of device circuitry, such as metal interconnects, transistors, and other devices found in integrated circuits. Ensuring the integrity of such devices is important for maintaining proper circuit function, reliability, and longevity. Therefore, the semiconductor industry would benefit from practical methods for analyzing semiconductor devices that require back side access to circuitry within such devices. In addition, the semiconductor industry would further benefit from practical methods for analyzing semiconductor devices during their manufacture. Testing devices during their manufacture, among other things, would provide an opportunity to test the device non-destructively without the need for accessing through substrate in the back side of the device.

SUMMARY OF THE INVENTION

The present invention is exemplified in a number of implementations and applications, some of which are summarized below. According to an example embodiment, the present invention is directed to a method for testing active circuitry in a semiconductor device having a circuit side and an opposing back side. A laser is directed at the device via the back side and circuitry in the circuit side is selectively excited. In response to exciting circuitry, target circuitry is monitored and a degree of integrity of the operation of the semiconductor device is determined. This embodiment provides, among other things, an innovative method for testing semiconductor devices requiring or benefiting from back side testing.

According to another example embodiment, the present invention includes an apparatus for testing a semiconductor device having a circuit side, an opposing back side, active circuitry, and an active device coupled via circuitry to output pins. The system comprises an ion bombardment device for removing substrate from the back side of the device. A power supply is used for powering the device at a stress power level, and a laser device is used for exciting the active circuitry. Monitors are used to monitor target circuitry coupled to the active circuitry and to monitor passive emissions of the active device. The monitored target circuitry and passive emissions are used by a processor to determine a degree of integrity of the operation of the semiconductor device.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
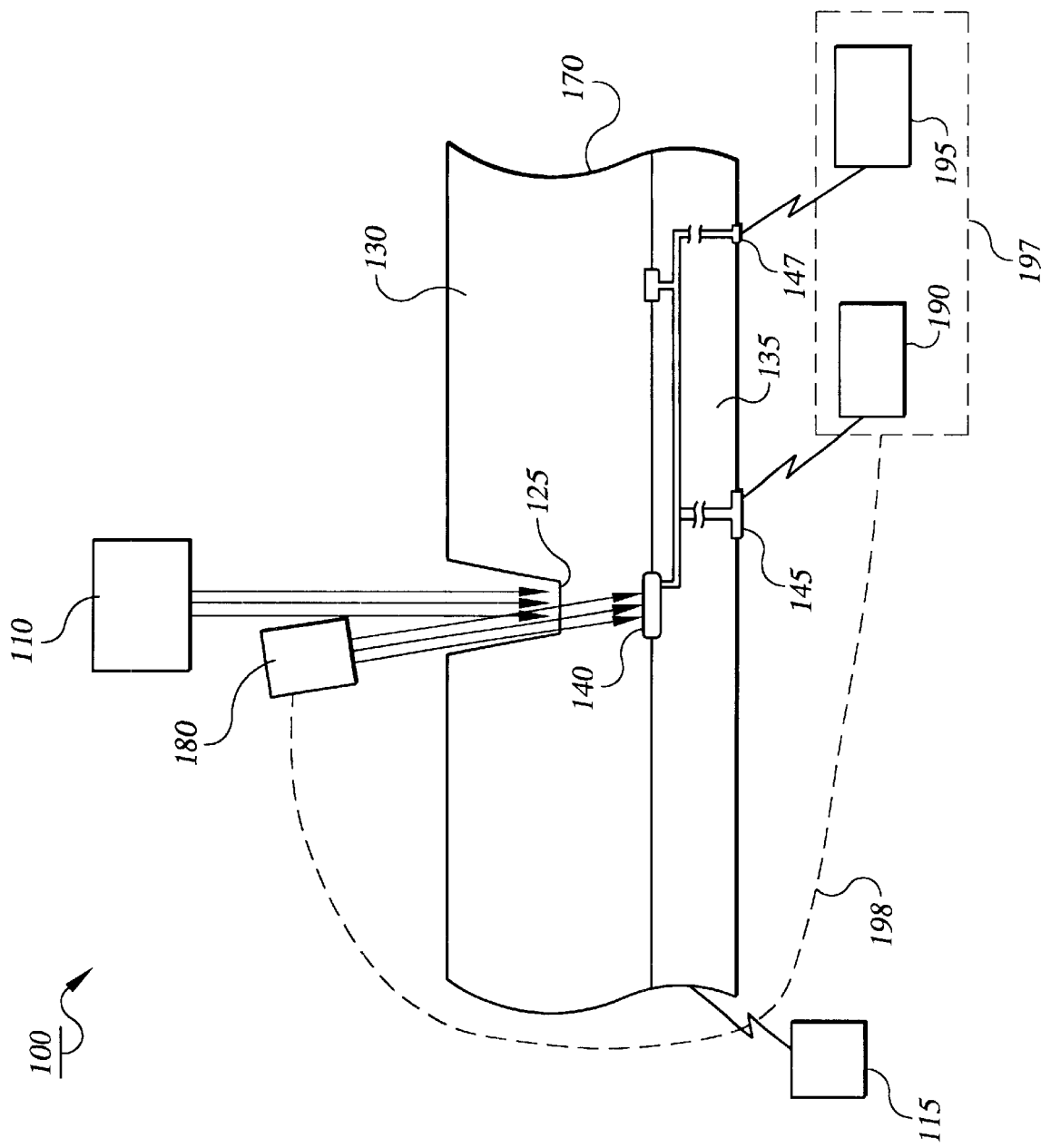
FIG. 1 shows a semiconductor device under test, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and the invention has been found to be particularly suited for devices requiring or benefiting from methods of testing during or subsequent to manufacture. While the present invention is not necessarily limited to such devices, various aspects of the invention may be appreciated through a discussion of various examples using this context.

Testing semiconductor devices often involves direct access to circuitry or devices through the back side of the device. The testing method and apparatus described herein provides a new method for determining the integrity of circuitry within a semiconductor device without necessarily directly physically accessing the circuitry or devices with in the flip-chip. A degree of integrity determined may, for example, include a determination of a pass or fail condition of the device, open circuits, short circuits, or a threshold level response, such as a particular active or passive response from the device.

In connection with an example embodiment of the present invention, it has been discovered that a laser can be applied to the back side of a semiconductor device to induce responses that can be monitored and used to determine the integrity of the circuitry within the device. In one application, the laser is applied to the device during its manufacture, or applied to a thinned portion of the back side subsequent to the manufacturing process. Directly accessing the circuitry from the back side is timeconsuming, difficult, and can result in damage to the device. Therefore, either testing the device during its manufacture or testing the device using a thinned portion of the back side subsequent to manufacturing reduces cost and increases the efficiency and effectiveness of the testing process.

According to an example embodiment, the present invention includes a method for testing active circuitry in a semiconductor device having a circuit side and an opposing back side. During manufacture of the device, or subsequent to removing substrate from a portion of the back side of the device, the device is powered at a stress power level, a laser is directed at a the device via the back side, and circuitry in the circuit side is selectively excited. In one embodiment, the laser has a wavelength of about 1064 nanometers and generates electron-hole pairs. Electron hole-pairs sometimes contribute to optical beam induced current (OBIC) that can excite the circuitry. In another embodiment the laser has a wavelength of about 1320 nanometers and generates thermal carrier movements that can also excite the circuitry. A response is detected which indicates a degree of integrity of the operation of the semiconductor device. For example, portions of the device for which the degree of integrity is determined may include the target circuitry, the active circuitry, and the feedback path between the target and active circuitry. In addition, the response can be detected via output pins on the device, via passive emissions from the device, or via other suitable detection, and can be further used to control the laser.

According to a more particular example embodiment, signals are input to the semiconductor device via inputs to the device. For example, the input signals can include static logic levels, stress voltages, sequenced signals, or a combination thereof, depending on the circuitry and its desired responsiveness. The signals or combinations of signals can be chosen for testing a particular aspect or condition of operation of the device. If a circuit is known to respond in a particular manner to a specific set of instructions, those instructions can be input and the reaction can be monitored. The steps of monitoring and inputting can also be repeated to generate a series of test data. Using this technique, failure modes and other desired circuit attributes can be analyzed.

In another example embodiment, the stress power level is a function of the operating characteristics of the semiconductor device. The power level is chosen to put the device in a condition near its operating point, such as at a minimum or maximum voltage in a threshold range. By further exciting circuitry in the device, the threshold can be exceeded and the circuitry can be pushed into operation. For example, circuitry designed to turn on at a particular power level can be powered at a level just below that power necessary to turn it on. The circuitry is then further excited by a laser directed via the back side of the semiconductor device. The laser-induced excitation causes the circuitry to turn on.

According to a particular example embodiment, the passive emissions from the active device are monitored using a device such as a time-resolved near-infrared detector or a two-way PICA probe. The passive emissions created in the laser-excited circuitry within the device may include the generation of photons, which can be monitored for determination of one or more aspects of the semiconductor device. For instance, these passive emissions can be used to determine a degree of integrity of the operation of the semiconductor device, used as a parameter for determining how to proceed with the testing process, or used for controlling the laser.

Using a laser to induce electron-hole pairs and/or thermal carrier movements is particularly beneficial because the laser energy supply is easily controlled. According to another example embodiment of the present invention, the application of the laser is selectively controlled so the active circuitry upon which the laser is directed is near a threshold corresponding to its operating point. Maintaining the active circuitry near its operating point is advantageous because it allows the shifting of the output characteristics of the active device, such as the phase characteristics, via the laser source. The laser can be selectively controlled to push the circuitry over the threshold and into operation. Furthermore, the laser can be selectively controlled to provide less excitation to the circuitry and cause the circuitry to drop below the threshold level and out of operation. This embodiment demonstrates an advantage of using a laser to operate active circuitry within the device in that it provides a simple and controllable manner in which to cause the device to move into or out of operation.

Referring now to FIG. 1, and according to an example embodiment of the present invention, a milling device 110 is used to remove substrate from the back side 130 of a semiconductor device 170, and a region having a bottom area 125 is formed. The semiconductor device 170 is coupled to and powered at a stress power level by a power supply 115. In a specific example embodiment, the milling device 110 includes at least one of: a laser etching device, a FIB device, a chemical-mechanical polishing device, an ion bombardment device, or other similar device. A laser source 180 is directed at the bottom area 125 and toward a device 140 within the circuit side 135 of the semiconductor device 170, and electron-hole pairs are generated. The device 140 is coupled via circuitry to an output port 145. Inputting device 195 inputs signals to the semiconductor device 170 via an input 147. A monitor 190, such as a computer arrangement or a measuring device, is coupled to the output port 145 of the device, and is configured and arranged to measure a response which indicates a degree of integrity of a portion of the circuitry within the semiconductor device. The response may, for instance, include certain aspects that are known to indicate a device that is properly functioning, or have certain aspects that are indicative of a particular failure mode of the device or a portion of the device. In addition, the steps of inputting and monitoring may be repeated to determine the degree of integrity of a portion of the circuitry within the semiconductor device.

In a more particular example embodiment of the present invention, and referring again to FIG. 1, the monitor 190 and the inputting device 195 are included in a testing apparatus 197. The testing apparatus 197 may include a computer configured and arranged to input signals and monitor the response. In a further example embodiment, the testing apparatus 197 is also coupled to control the laser source via coupling 198, and can be used to operate the laser in a manner that maintains the device 140 at or near its operating point.

Figure 2:
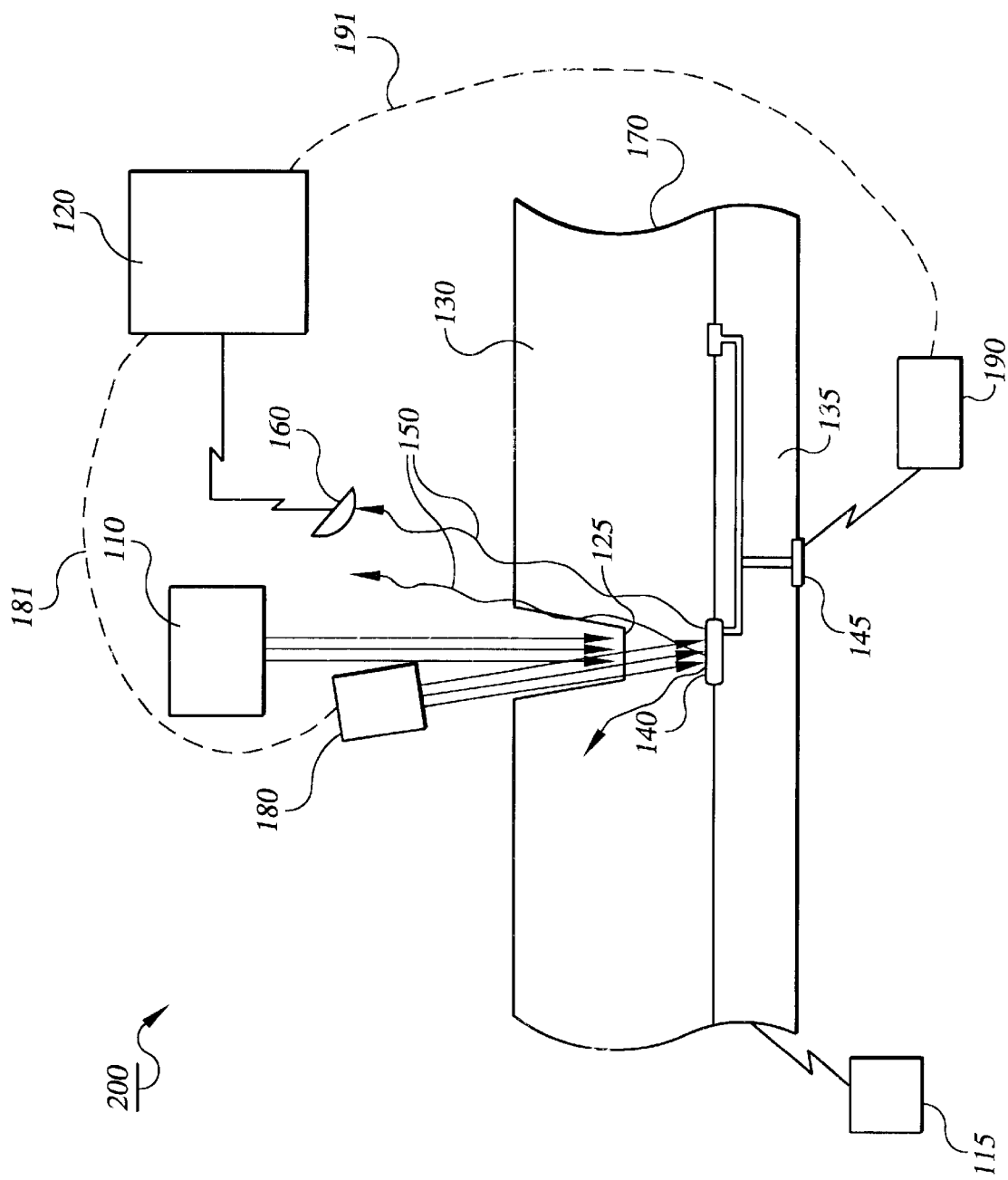
FIG. 2 shows a semiconductor device under test, according to another example embodiment of the present invention.

FIG. 2 illustrates another example embodiment of the present invention in which the passive emissions of the device 140 are monitored. The passive emissions may include, for example, photons depicted as directed curves 150. The photons are monitored by a detector 160, such as a time-resolved near-infrared detector or a twoway PICA probe. The detector 160 may further be coupled to a processor 120 for processing the detected photons as information.

In a more particular example embodiment of FIG. 2, the monitor 190 and the processor 120 are coupled via coupling 191 and form a testing apparatus. In a further example embodiment, the processor 120 is coupled to control the laser source 180 via coupling 181, and can be used to operate the laser in a manner that maintains the device 140 at or near its operating point.

According to yet another example embodiment, the present invention is directed toward a system for testing a semiconductor device, wherein the device has a circuit side, a back side, and an active device coupled via circuitry to output pins. The system includes apparatuses for removing substrate from the back side of the device, for exciting active circuitry and generating electron-hole pairs, and for monitoring target circuitry coupled to the active circuitry via an output port of the device.

While the present invention has been described with reference to several particular example embodiments, those skilled in the art will recognize that many changes may be made thereto without departing from the spirit and scope of the present invention, which is set forth in the following claims.

What is claimed is:

1. A method for testing active circuitry in a semiconductor device having a circuit side and an opposing back side, the method comprising:

powering the device at a stress power level;

directing a laser at the device via the back side and selectively exciting circuitry in the circuit side;

monitoring target circuitry responsive to exciting the circuitry; and determining, in response to the step of monitoring, a degree of integrity of the operation of the semiconductor device.

2. A method for testing, according to claim 1, further comprising removing substrate from a portion of the back side of the semiconductor device.

3. A method for testing, according to claim 1, wherein the active circuitry is tested during the manufacture of the device.

4. A method for testing, according to claim 1, further comprising inputting signals to the semiconductor device via inputs to the semiconductor device.

5. A method for testing, according to claim 4, wherein the steps involving monitoring and inputting are repeated until a degree of integrity of the operation of the semiconductor device is determined.

6. A method for testing, according to claim 1, wherein the semiconductor device includes output pins, and wherein monitoring target circuitry includes monitoring the device output via the output pins.

7. A method for testing, according to claim 1, wherein monitoring target circuitry includes monitoring passive emissions from the device.

8. A method for testing, according to claim 1, further comprising controlling the laser responsive to monitoring target circuitry.

9. A method for testing, according to claim 1, wherein directing a laser at the device comprises:

using a laser having a wavelength of about 1064 nanometers; and causing the generation of electron hole-pairs.

10. A method for testing, according to claim 1, wherein directing a laser at the device comprises:

using a laser having a wavelength of about 1320 nanometers; and causing the generation of thermal carrier movements.

11. A method for testing, according to claim 1, wherein powering the device at a stress power level comprises powering the device at a minimum voltage in a threshold range.

12. A method for testing, according to claim 1, wherein powering the device at a stress power level comprises powering the device at a maximum voltage in a threshold range.

13. A method for testing, according to claim 1, wherein directing a laser at the device comprises:

selectively controlling the laser;

causing the active circuitry to exceed the threshold of its operating characteristics and effecting the output of the device circuitry coupled thereto; and detecting the output characteristics.

14. A method for testing, according to claim 13, wherein effecting the output of the device circuitry includes shifting its output phase characteristics.

15. A method for testing, according to claim 13, further comprising using a computer.

16. The method of claim 1, wherein powering the device at a stress power level includes powering circuitry in the device at a power level just below the power level necessary to turn the circuitry on, and wherein directing a laser at the device via the back side and selectively exciting circuitry in the circuit side includes exciting the circuitry and causing the circuitry to turn on.

17. A system for testing active circuitry in a semiconductor device having a circuit side, an opposing back side, and an active device coupled via circuitry to output pins, the system comprising:

means for powering the device at a stress power level;

a laser source for exciting the active circuitry via the back side by generating at least one of: electron hole-pairs and thermal carrier movements;

means for monitoring target circuitry, coupled to the active circuitry, via an output port of the device; and means for determining a degree of integrity of the operation of the semiconductor device responsive to the means for monitoring target circuitry.

18. A system for testing a semiconductor device, according to claim 17, wherein the means for monitoring the target circuitry includes at least one of: a computer arrangement and a measurement device.

19. A system for testing a semiconductor device, according to claim 17, further comprising means for monitoring passive emissions of the active device.

20. A system for testing a semiconductor device, according to claim 19, wherein the means for monitoring passive emissions includes at least one of: a time-resolved nearinfrared detector and a two-way PICA probe.

* * * * *

UNITED STATES PATENT AND TRADEMARK OFFICE
CERTIFICATE OF CORRECTION

PATENT NO. : 6,417,680 B1
DATED : July 9, 2002
INVENTOR(S) : Birdsley et al.

It is certified that error appears in the above-identified patent and that said Letters Patent is hereby corrected as shown below:

Column 3,
Line 37, "timeconsuming" should read -- time-consuming.

Column 8,
Lines 6-7, "nearin-frared" should read -- near-infrared --.

Signed and Sealed this

Third Day of December, 2002

JAMES E. ROGAN
*Director of the United States Patent and Trademark Office*